US008829514B2

(12) United States Patent
Zan et al.

(10) Patent No.: US 8,829,514 B2
(45) Date of Patent: Sep. 9, 2014

(54) THIN FILM TRANSISTOR AND METHOD FOR MANUFACTURING THE SAME

(71) Applicant: E Ink Holdings Inc., Hsinchu (TW)

(72) Inventors: Hsiao-Wen Zan, Hsinchu (TW); Chuang-Chuang Tsai, Hsinchu (TW); Chun-Hung Liao, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/711,540

(22) Filed: Dec. 11, 2012

(65) Prior Publication Data
US 2013/0153891 A1    Jun. 20, 2013

Related U.S. Application Data

(60) Provisional application No. 61/570,303, filed on Dec. 14, 2011.

(30) Foreign Application Priority Data

Jun. 19, 2012   (TW) .............................. 101121927 A
Oct. 25, 2012   (TW) .............................. 101139494 A

(51) Int. Cl.
*H01L 29/78*   (2006.01)
*H01L 29/66*   (2006.01)

(52) U.S. Cl.
CPC .......... *H01L 29/78* (2013.01); *H01L 29/66742* (2013.01)
USPC ............. 257/43; 257/E21.455; 257/E21.461; 257/E21.468; 257/E29.094

(58) Field of Classification Search
USPC ................... 257/E21.455, E21.461, E21.468, 257/E29.225, E29.445
See application file for complete search history.

(56) References Cited

U.S. PATENT DOCUMENTS 7,122,079 B2    10/2006   Xu et al.
(Continued)

FOREIGN PATENT DOCUMENTS

TW    201214711 A    4/2012
TW    201218377 A    5/2012

OTHER PUBLICATIONS

Effective Mobility Enhancement by Using Nanometer Dot Doping in Amorphous IGZO Thin-Film Transistors, Hsiao-Wen Zan, Wu-Wei Tsai, Chia-Hsin-Chen, and Chuang-Chuang Tsai, Adv. Mater., 23: 4237-4242., Aug. 11, 2011, Published on-line at www.Materialsviews.com. (See Informational Disclosure Statement).*

(Continued)

*Primary Examiner* — Earl Taylor
*Assistant Examiner* — Stephen C Smith
(74) *Attorney, Agent, or Firm* — CKC & Partners Co., Ltd.

(57) ABSTRACT

Disclosed herein is a thin film transistor, which includes a metal oxide semiconductor layer, an insulating layer, a gate electrode, a source electrode and a drain electrode. The metal oxide semiconductor layer includes a channel region having at least one first region and a second region. The first region has an oxygen vacancy concentration greater than an oxygen vacancy concentration of the second region. The second region surrounds the first region. A method for manufacturing the thin film transistor is disclosed as well.

17 Claims, 15 Drawing Sheets

(56) References Cited

U.S. PATENT DOCUMENTS

| | | |
|---|---|---|
| 7,691,666 B2 | 4/2010 | Levy et al. |
| 7,708,542 B2 | 5/2010 | Bailey et al. |
| 7,795,613 B2 | 9/2010 | Ito et al. |
| 7,820,064 B2 | 10/2010 | Jin |
| 7,906,180 B2 | 3/2011 | Xu et al. |
| 7,915,651 B2 | 3/2011 | Hoffman |
| 2010/0127242 A1 | 5/2010 | Zhou et al. |

OTHER PUBLICATIONS

Effective mobility enhancement by using nanometer dot doping in amorphous IGZO thin-film transistors (Hsiao-Wen Zan, Wu-Wei Tsai, Chia-Hsin-Chen, and Chuang-Chuang Tsai / Adv. Mater., 23: 4237-4242., Aug. 11, 2011).

Corresponding TW Office Action.

* cited by examiner

THIN FILM TRANSISTOR AND METHOD FOR MANUFACTURING THE SAME

RELATED APPLICATIONS

This application claims priority to U.S. Provisional Application Ser. No. 61/570,303 filed Dec. 14, 2011, Taiwan Application Serial Number 101121927, filed Jun. 19, 2012, and Taiwan Application Serial Number 101139494, filed Oct. 25, 2012, the contents of each of which are herein incorporated by reference in their entireties.

BACKGROUND

1. Technical Field

The present invention relates to a thin film transistor and a method for manufacturing the same.

2. Description of Related Art

Metal-oxide semiconductor thin film transistors (MOS TFTs) are advantageous in high electron mobility, excellent electrical characteristics and manufacturing at low temperature, and therefore gain much attention. Recently, MOS TFTs are developed for application in radio frequency identification techniques (RFID) and flexible display devices. In a low-power and high-frequency circuit, it requires MOS TFTs having much higher electron mobility, as compared with conventional MOS TFTs. However, the electron mobility of typical MOS TFTs is less than 35 $cm^2V^{-1}s^{-1}$, and is unsatisfied. Accordingly, there exists in this art a need for a novel MOS TFT that would provide excellent electron mobility.

SUMMARY

According to one aspect of the present disclosure, a thin film transistor is provided. The thin film transistor includes a metal oxide semiconductor layer, an insulating layer, a gate electrode; a source electrode and a drain electrode. The metal oxide semiconductor layer includes a channel region, a source region and a drain region. The channel region has at least one first region and a second region, in which the first region has an oxygen vacancy concentration greater than an oxygen vacancy concentration of the second region. The first region is surrounded by the second region. The source region and the drain region are respectively disposed at opposite sides of the channel region. The insulating layer is disposed on the channel region. The gate electrode is disposed on the insulating layer. The source electrode and the drain electrode are connected electrically to the source region and the drain region, respectively.

According to another aspect of the present disclosure, there is provided a method for manufacturing a thin film transistor. The method includes the steps of: (a) forming a metal oxide semiconductor layer on a substrate the metal oxide semiconductor layer having an initial oxygen vacancy concentration; (b) forming a first insulating layer on the metal oxide semiconductor layer; (c) forming a first patterned conductive layer on the first insulating layer, wherein the first patterned conductive layer has at least one first opening, and a projection of the first opening onto the substrate overlaps a projection of the metal oxide semiconductor layer onto the substrate; (d) treating the metal oxide semiconductor layer to form a channel region having at least one first region by using the first patterned conductive layer as a mask such that the first region has an oxygen vacancy concentration greater than the initial oxygen vacancy concentration; and (e) forming a source electrode and a drain electrode respectively on opposite sides of the channel region.

It is to be understood that both the foregoing general description and the following detailed description are by examples, and are intended to provide further explanation of the invention as claimed.

DETAILED DESCRIPTION

Figure 1:
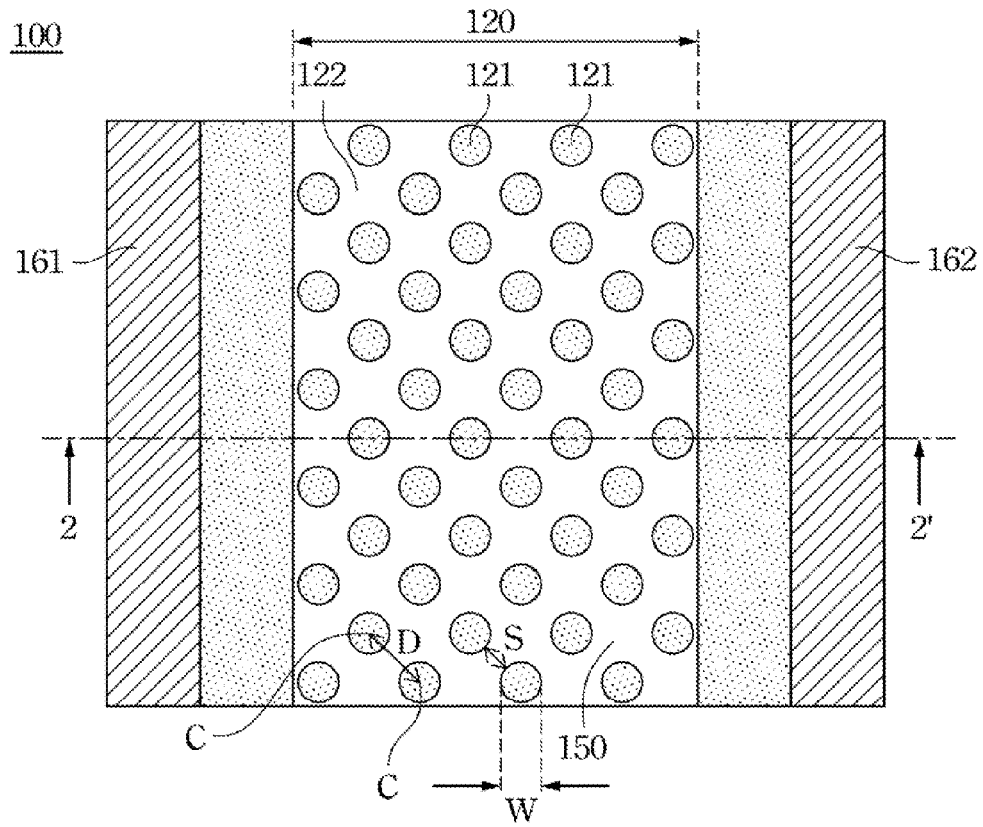
FIG. 1 is a top view schematically illustrating a thin film transistor according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 2:
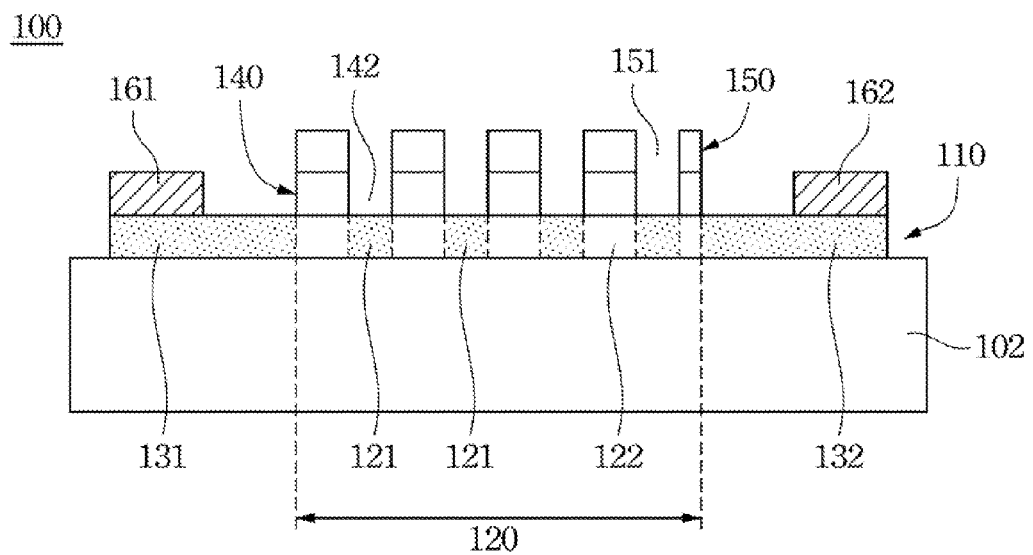
FIG. 2 is a cross-sectional view along line 2-2' in FIG. 1.

FIG. 1 is a top view schematically illustrating a thin film transistor 100 according to one embodiment of the present disclosure. FIG. 2 is a cross-sectional view along line 2-2' in FIG. 1. As shown in FIG. 2, the thin film transistor 100 includes a metal oxide semiconductor layer 110, a gate insulating layer 140, a gate electrode 150, a source electrode 161 and a drain electrode 162.

With reference to FIG. 1 and FIG. 2, the metal oxide semiconductor layer 110 includes a channel region 120, a source region 131 and a drain region 132. The metal oxide semiconductor layer 110 may includes at least one of indium gallium zinc oxide (IGZO), indium zinc oxide (IZO) and indium zinc tin oxide (IZTO), for example. It is discovered that the oxygen vacancy concentration in the metal oxide semiconductor layer 110 has a considerable influence on the electrical properties of the metal oxide semiconductor layer 110. And one of the features of the present disclosure is that the metal oxide semiconductor layer 110 has at least two different oxygen vacancy concentrations in different regions, which is described in detail hereinafter.

The channel region 120 has a plurality of first regions 121 and a second region 122. Each of the first regions 121 has an oxygen vacancy concentration that is greater than the oxygen vacancy concentration of the second region 122. In one embodiment, the oxygen vacancy concentrations of both the first and second regions 121, 122 are the initial oxygen vacancy concentration that is determined in the process of depositing the metal oxide semiconductor layer 110. The oxygen vacancy concentration of the first region 121 is further increased in the following process by suitable treatments such that the oxygen vacancy concentration of the first region 121 is greater than the oxygen vacancy concentration of the second region 122. In one embodiment, the oxygen vacancy concentration of each the first region 121 is about 1.1 to about 1.3 folds of the oxygen vacancy concentration of the second region 122. That is, the ratio of the oxygen vacancy concentration of each the first region to the oxygen vacancy concentration of the second region ranges from about 1.1 to about 1.3. In examples, when the ratio of the oxygen vacancy concentration of the first region 121 to the oxygen vacancy concentration of the second region 122 is less than 1.1, the mobility of the channel region 120 is marginally improved. On the other hand, when the ratio is greater than 1.3, it is unfavorable to the performance of the thin film transistor 100. Specifically, the thin film transistor 100 may not be turned off. In another embodiment, each of the first regions 121 has a relative oxygen vacancy concentration of about 23-27%, whereas the second region 122 has a relative oxygen vacancy concentration of about 18-22%. The relative oxygen vacancy concentration aforementioned is calculated by the method proposed by S. Jeong et. al (Adv. Mater. 2010, 22, 1346).

Each of the first regions 121 is spaced apart from another one of the first regions 121 in the channel region 120, and the second region 122 surrounds each of the first regions 121. For example, these first regions 121 are distributed in the second region 122. In one embodiment, the first regions 121 of the channel region 120 are arranged in a number density of about $1 \times 10^6$ mm$^{-2}$ to about $1 \times 10^7$ mm$^{-2}$. The turn "number density" herein refers to the number of entities per unit surface area. According to some embodiments of the present disclosure, then the number density of the first regions 121 is less than about $1 \times 10^6$ mm$^{-2}$, the thin film transistor 100 merely exhibits a limited increase in the effective field-effect mobility. To the contrary, when the number density of the first region 121 is greater than about $1 \times 10^7$ mm$^{-2}$, the thin film transistor 100 may not appropriately be turned off.

In another embodiment, each of the first regions 121 has a width W of about 1 nm to about 1 μm, specifically about 10 nm to about 300 nm. When the dimension of the first region 121 is greater than about 1 μm, the number density of the first regions 121 may be decrease. In contrast, when the dimension of the first regions 121 is less than 1 nm, it renders the manufacturing process difficult. In one example, each of the first regions 121 has a contour with a geometry center C. The distance D between any two adjacent geometry centers C is about 51 nm to about 1500 nm when the width W of each of the first regions 121 is about 10 nm to about 300 nm. The width W and the distance D aforementioned are designed based on the consideration of the number density of the first regions 121, the electrical performance of the device and the process feasibility.

In still another embodiment, the spacing interval S between any two adjacent first regions 121 ranges from about 50 nm to about 500 nm. As described above, each of the first regions 121 is not in contact with another one of the first regions 121 in the channel region 120. According to the embodiments of the present disclosure, when the spacing interval S between the first regions 121 is less than about 50 nm, the two adjacent first regions 121 are substantially connected with each other due to the diffusion of the oxygen vacancies, and therefore the thin film transistor 100 may not appropriately be turned off. On the other hand, when the spacing interval S between two adjacent first regions 121 is greater than about 500 nm, the amount of the first regions 121 per unit area may be decreased. As a result, the increase in the effective field-effect mobility of the thin film transistor 100 is limited.

The metal oxide semiconductor layer 110 further includes a source region 131 and a drain region 132 respectively positioned at opposite sides of the channel region 120. In one embodiment, the oxygen vacancy concentrations of the source and drain regions 131, 132 are greater than the oxygen vacancy concentration of the second region 122 in the channel region 120. In one specific example, the oxygen vacancy concentrations of the source and drain regions 131, 132 are substantially the same as the oxygen vacancy concentration of the first region 121.

The gate insulating layer 140 and the gate electrode 150 are disposed above the metal oxide semiconductor layer 110. Specifically, the gate insulating layer 140 is disposed on the channel region 120 of the metal oxide semiconductor layer 110, and the gate electrode 150 is disposed on the gate insulating layer 140. The gate insulating layer 140 is configured to prevent the gate electrode 150 from contact with the metal oxide semiconductor layer 110. In one example, the gate insulating layer 140 may be made of a transparent oxide material such as silicon oxide or silicon nitride. In another example, the gate insulating layer 140 may be made of a polymeric material. The gate electrode 150 may be made of a transparent conductive oxide or a metal such aluminum, nickel, copper and neodymium.

In one embodiment, the gate electrode 150 has a plurality of first openings 151 penetrating the gate electrode 150, and each of the first openings 151 is positioned right above a corresponding one of the first regions 121. In one specific example, each of the first openings 151 has a contour that is substantially the same as the contour of the corresponding first region 121. For example, both the first opening 151 and the first region 121 have circular contours, and the first openings 151 are aligned with the first region 121.

In another embodiment, the gate insulating layer 140 has a plurality of second openings 142 penetrating the gate insulating layer 140, and each of the second openings 142 are substantially aligned with a corresponding one of the first openings 151. In this embodiment, the first opening 151 and the second opening 142 expose the first region 121 of the channel region 120. In one specific example, the gate insulating layer 140 and the gate electrode 150 have a substantially identical pattern.

The source electrode 161 and the drain electrode 162 are respectively connected electrically to the source region 131 and the drain region 132 of the metal oxide semiconductor layer 110. For instance, the source electrode 161 and the drain electrode 162 may be made of metal or a transparent conductive oxide. The source electrode 161 and the drain electrode 162 are disposed on and in contact with the source region 131 and the drain region 132, respectively.

According to one embodiment of the present disclosure, all components of the thin film transistor 100 such as the metal oxide semiconductor layer 110, the gate insulating layer 140, the gate electrode 150, the source electrode 161 and the drain electrode 162 are made of a transparent material, and the thin film transistor 100 is formed on a window glass 102, as depicted in FIG. 2. In this embodiment, the window glass 102 having the thin film transistor 100 may be applied in fields such as radio frequency identification (RFID).

Figure 3:
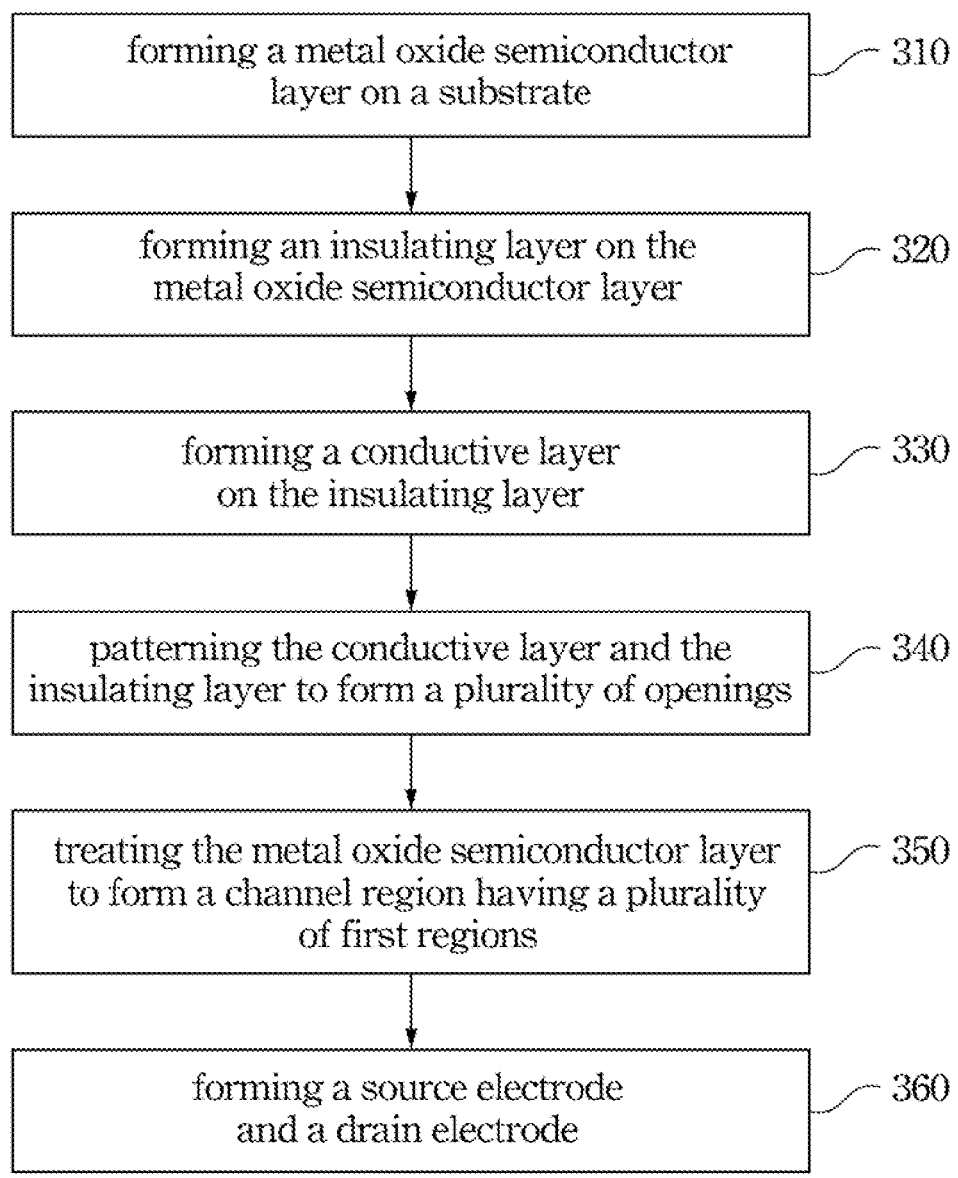
FIG. 3 is a flow chart illustrating a method for manufacturing a thin film transistor.

According to another aspect of the present disclosure, a method for manufacturing a thin film transistor is provided. FIG. 3 is a flow chart illustrating a method 300 for manufacturing a thin film transistor. The method 300 includes steps 310, 320, 330, 340, 350 and 360. FIGS. 4-7 are cross-sectional views illustrating the process steps of the method 300 illustrated in FIG. 3.

Figure 4:
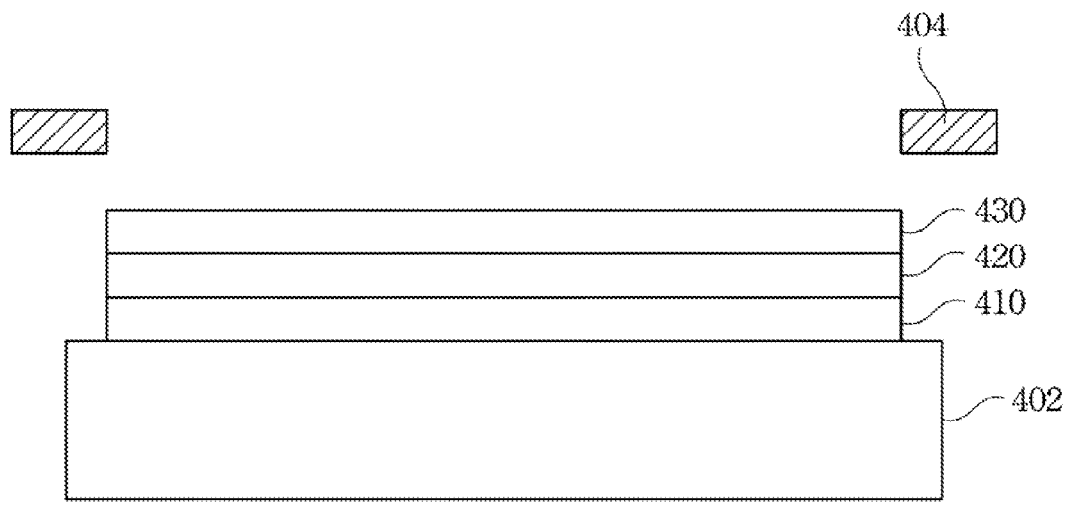
FIGS. 4-7 are cross-sectional views illustrating the process steps of the method illustrated in FIG. 3.

In step 310, a metal oxide semiconductor layer 410 is formed on a substrate 402, as depicted in FIG. 4. The metal oxide semiconductor layer 410 may be formed by a sputtering process, and the metal oxide semiconductor layer 410 has an initial oxygen vacancy concentration when being formed on the substrate 402. In one embodiment, metal oxide semiconductor layer 410 includes indium gallium zinc oxide (IGZO).

In step 320, an insulating layer 420 is formed on the metal oxide semiconductor layer 410, as depicted in FIG. 4. The insulating layer 420 may be made of an organic material or an inorganic material. In one example, the insulating layer 420 is made of a polymeric material such as poly(4-vinyl) phenol (PVP). In other examples, the insulating layer 420 may be made of silicon oxide or silicon nitride.

In step 330, a conductive layer 430 is formed on the insulating layer 420, as depicted in FIG. 4. The conductive layer 430 may be composed of a signal layer or multiple layers. In one example, the conductive layer 430 may comprise aluminum, nickel, copper, neodymium or a combination thereof. In another example, the conductive layer 430 may be made of a transparent conductive oxide.

In one embodiment, the metal oxide semiconductor layer 410, the insulating layer 420 and the conductive layer 430 described in steps 310-330 are sequentially formed by physical vapor deposition processes, in which a shadow mask 404 is used, and thereby forming the stack structure depicted in FIG. 4. In one example, the stack structure formed by using the shadow mask 404 has a width and/or a length of about 100 μm to about 3000 μm.

Figure 5:
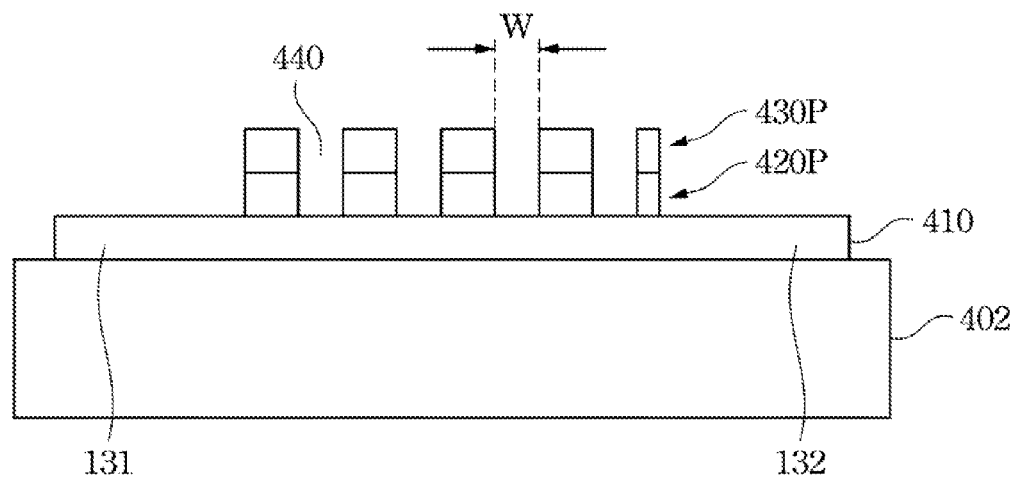

In step 340, the conductive layer 430 and the insulating layer 420 are patterned to form a plurality of openings 440 penetrating both the conductive layer 430 and the insulating layer 420, as depicted in FIG. 5. A portion of the metal oxide semiconductor layer 410 is exposed through the openings 440. In one example, each of the openings 440 has a width W of about 1 nm to about 1 μm, preferably about 10 nm to about 300 nm. The conductive layer 430 and the insulating layer 420 are patterned, and thereby forming a patterned conductive layer 430P and a patterned insulating layer 420P. The patterned conductive layer 430P and the insulating layer 420P may respectively be used as the gate electrode 150 and the gate insulating layer 140 of the thin film transistor 100 described hereinbefore.

In one embodiment, the step 340 further includes removing a portion of the conductive layer 430 and a portion of the insulating layer 420, and thus allowing the source region 131 and the drain region 132 of the metal oxide semiconductor layer 410 are exposed, as depicted in FIG. 5. Specifically, the portions of the conductive layer 430 and insulating layer 420, that are positioned above the source region 131 and the drain region 132 of the metal oxide semiconductor layer 410, are removed such that the source region 131 and drain region 132 are exposed.

Figure 6A:
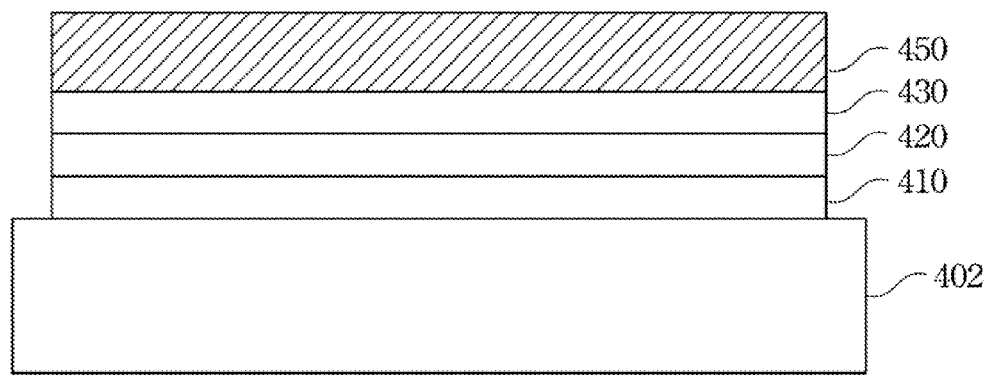
Figure 6B:
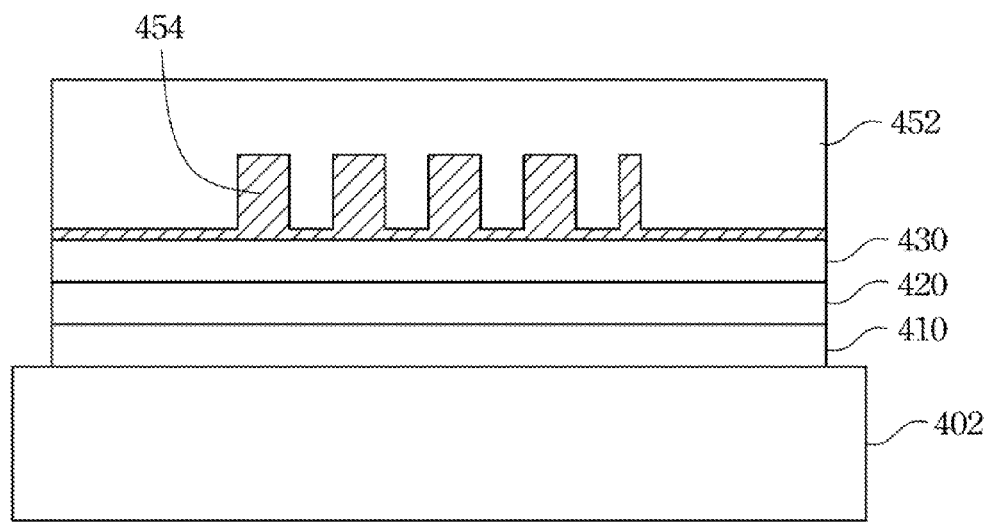
Figure 6C:
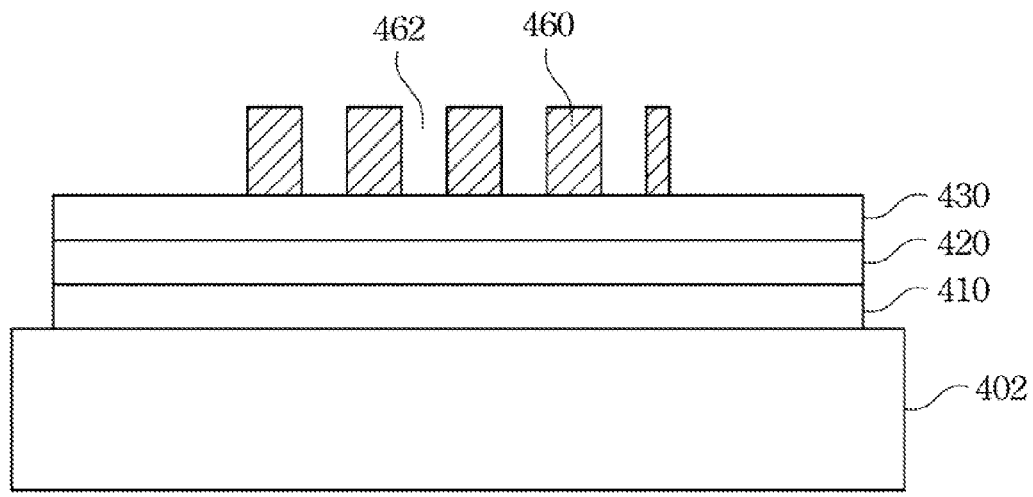
Figure 6D:
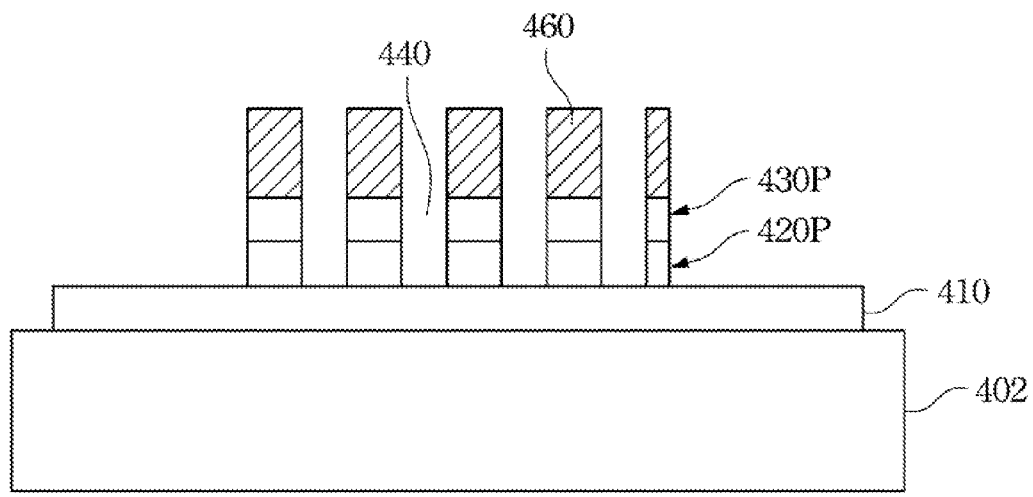

In another embodiment, the conductive layer 430 and the insulating layer 420 may be patterned by the method described below. Firstly, a polymer layer 450 is formed on the conductive layer 430, as depicted in FIG. 6A. Thereafter, the polymer layer 450 is imprinted by a patterned mode 452. The concavo-convex pattern formed on the patterned mode 452 is duplicated to the polymer layer 450, and thereby forming a patterned polymer layer 454, as depicted in FIG. 6B. Subsequently, as depicted in FIG. 6C, the patterned polymer layer 454 is treated by a plasma to reduce the thickness of the patterned polymer layer 454, and thus forming a resist layer 460. For example, oxygen plasma may be utilized to etch the patterned polymer layer 454 and reduce the thickness thereof, and thereby forming a plurality of apertures 462 exposing a portion of the conductive layer 430. After forming the resist layer 460, the exposed portion of the conductive layer 430 and a portion of the insulating layer 420 there under are removed so as to form the openings 440 described above, as depicted in FIG. 6D. A portion of the metal oxide semiconductor layer 410 may be exposed through the openings 440. After forming the openings 440, the resist layer 460 is removed, and accordingly the structure shown in FIG. 5 is realized.

Figure 7:
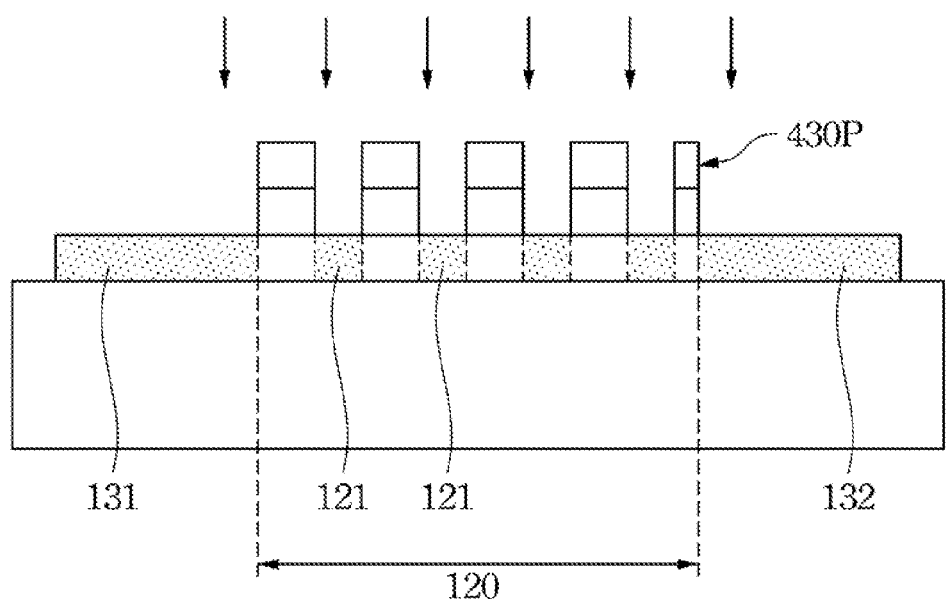

In step 350, as depicted in FIG. 7, by using the conductive layer 430P as a mask, the exposed portion of the metal oxide semiconductor layer 410 is treated to increase the oxygen vacancy concentration of the exposed portion of metal oxide semiconductor layer 410, and thus forming a channel region 120 having a plurality of the first regions 121. In other words, the oxygen vacancy concentration of each the first region 121 is increased, and is greater than the initial oxygen vacancy concentration described in step 310. In one embodiment, the exposed portion of the metal oxide semiconductor layer 410 is exposed to argon (Ar) plasma such that the oxygen vacancy concentration of the exposed portion of the metal oxide semiconductor layer 410 is increased. In another embodiment, ultraviolet light may be employed to illuminate the exposed portion of the metal oxide semiconductor layer 410, so that the oxygen vacancy concentration of the exposed portion of the metal oxide semiconductor layer 410 is increased. In still another embodiment, ozone is provided to the exposed portion of the metal oxide semiconductor layer 410 such that the exposed portion of the metal oxide semiconductor layer 410 is exposed to the ozone, and thereby increasing the oxygen vacancy concentration of the exposed portion of the metal oxide semiconductor layer 410.

Figure 8A:
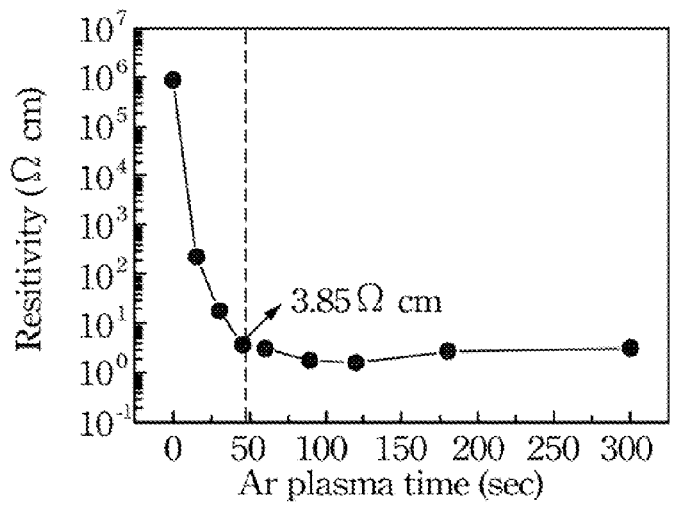
FIG. 8A is a graph showing the relationship between the treating time period of Ar plasma and the resistivity of an IGZO semiconductor layer according to one embodiment of the present disclosure.

FIG. 8A is a graph showing the relationship between the treatment time period of Ar plasma and the resistivity of an IGZO semiconductor layer according to one embodiment of the present disclosure. When the IGZO semiconductor layer is exposed to Ar plasma for 50 seconds the resistivity of the IGZO semiconductor layer is decreased from a level of greater than $10^5$ Ωcm to about 3.8 Ωcm. The relative oxygen vacancy concentration of the IGZO semiconductor layer is increased from 20.18% to 24.67%, calculated by the method proposed by S. Jeong et. al.

As described hereinbefore, in one embodiment, each of the first regions 121 has a contour with a geometry center C, and the distance D between any two adjacent geometry centers C is about 51 nm to about 1500 nm. In another embodiment, the spacing interval S between any two adjacent first regions 121 ranges from about 50 nm to about 500 nm. In still another embodiment, the number density of the first regions 121 is about $1\times10^6$ mm$^{-2}$ to about $1\times10^7$ in the channel region 120. In other embodiments, the ratio of the oxygen vacancy concentration of each the first region to the initial oxygen vacancy concentration ranges from about 1.1 to about 1.3

In one embodiment, the step 350 further includes treating the source region 131 and the drain region 132 of the metal oxide semiconductor layer 410 such that the oxygen vacancy concentrations of the source region 131 and the drain region 132 are greater than the initial oxygen vacancy concentration, as depicted in FIG. 7. In one example, the oxygen vacancy concentration of the treated source and drain regions 131, 132 substantially equal the oxygen vacancy concentration of the first region 121.

In step 360, a source electrode 161 and a drain electrode 162 are formed on the metal oxide semiconductor layer 110 at opposite sides of the channel region 120, and therefore forming the thin film transistor 100 depicted in FIG. 2. In one embodiment, the source and drain electrodes 161, 162 are formed on the treated source and drain regions 131, 132.

Figure 8B:
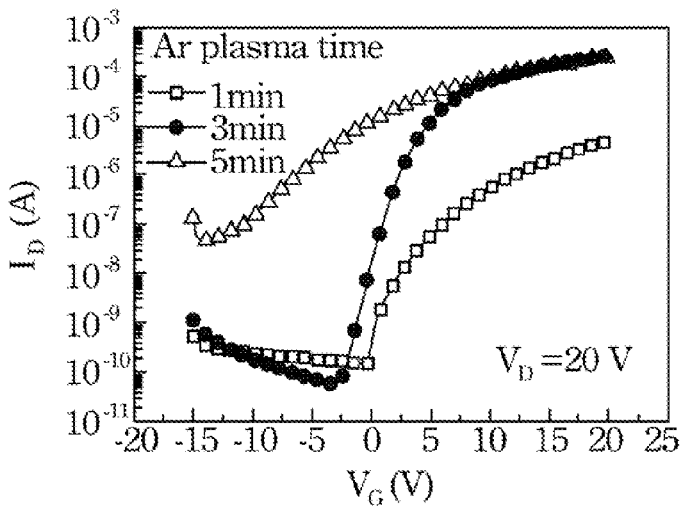
FIG. 8B is a graph showing the relationship between the gate voltage ($V_G$) and the drain current ($I_D$) of a thin film transistor according to one embodiment of the present disclosure.
Figure 8C:
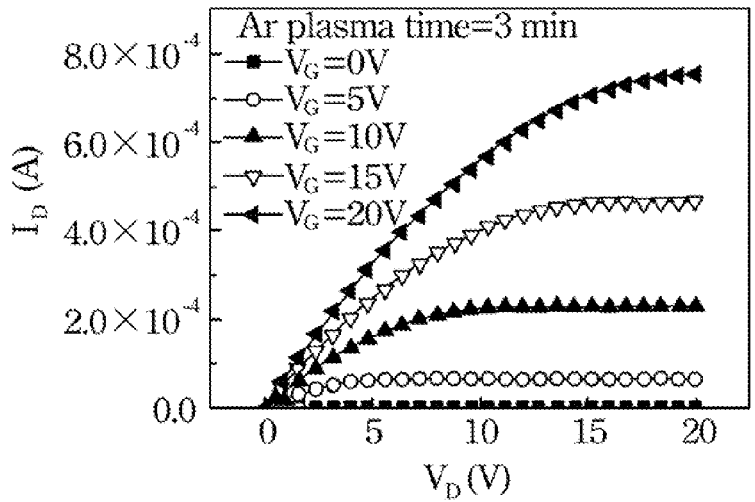
FIG. 8C is graph showing $I_D$-$V_D$ curves of thin film transistor according to one embodiment of the present disclosure.

FIG. 8B is a graph showing the relationship between the gate voltage ($V_G$) and the drain current ($I_D$) of a IGZO thin film transistor (TFT) when the drain voltage ($V_D$) is 20 V, according to one embodiment of the present disclosure. FIG. 8B depicts $V_G$-$I_D$ characteristic curves of TFTs manufactured with different Ar treatment time periods. In the case where the IGZO layer is treated by Ar plasma for 3 minutes, the on current ($I_D$) is greater than $10^{-4}$ A whereas the off current ($I_D$) is less than $10^{-9}$ A. The effective field-effect mobility is 79 $cm^2V^{-1}s^{-1}$. In the case where the IGZO layer is treated by Ar plasma for 5 minutes, the leakage current from the source electrode to drain electrode is raised so that the ON/OFF characteristic of the device is unsatisfied. FIG. 8C is graph showing $I_D$-$V_D$ curves of the TFT with the Ar treatment time period of 3 minutes. When $V_G$ ranges from 5 V to 20 V, the TFT exhibits excellent output characteristics. $I_D$ increases linearly with increasing $V_D$ at low $V_D$, and saturates at higher $V_D$.

The effective field-effect mobility of a conventional IGZO TFT is merely about $10\, cm^2V^{-1}s^{-1}$. According to the embodiment of the present disclosure, the mobility of the TFT is increased to a level that is 7-8 folds of the conventional IGZO TFT. In addition, the TFT disclosed herein exhibits excellent ON/OFF characteristics. Moreover, the method for manufacturing the TFT disclosed herein has an excellent productivity.

Figure 9:
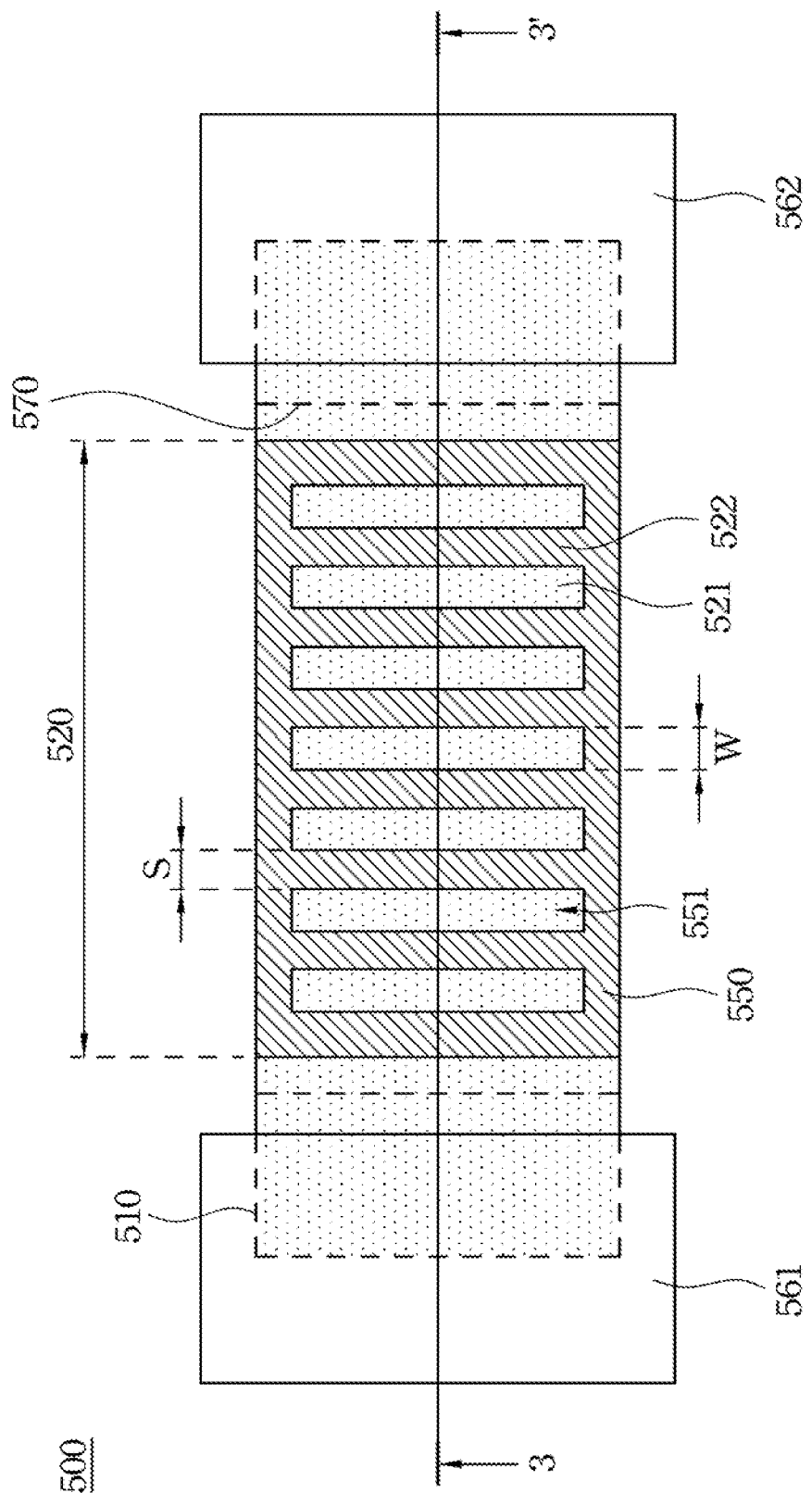
FIG. 9 is a top view schematically illustrating a thin film transistor according to another embodiment of the present disclosure.
Figure 10:
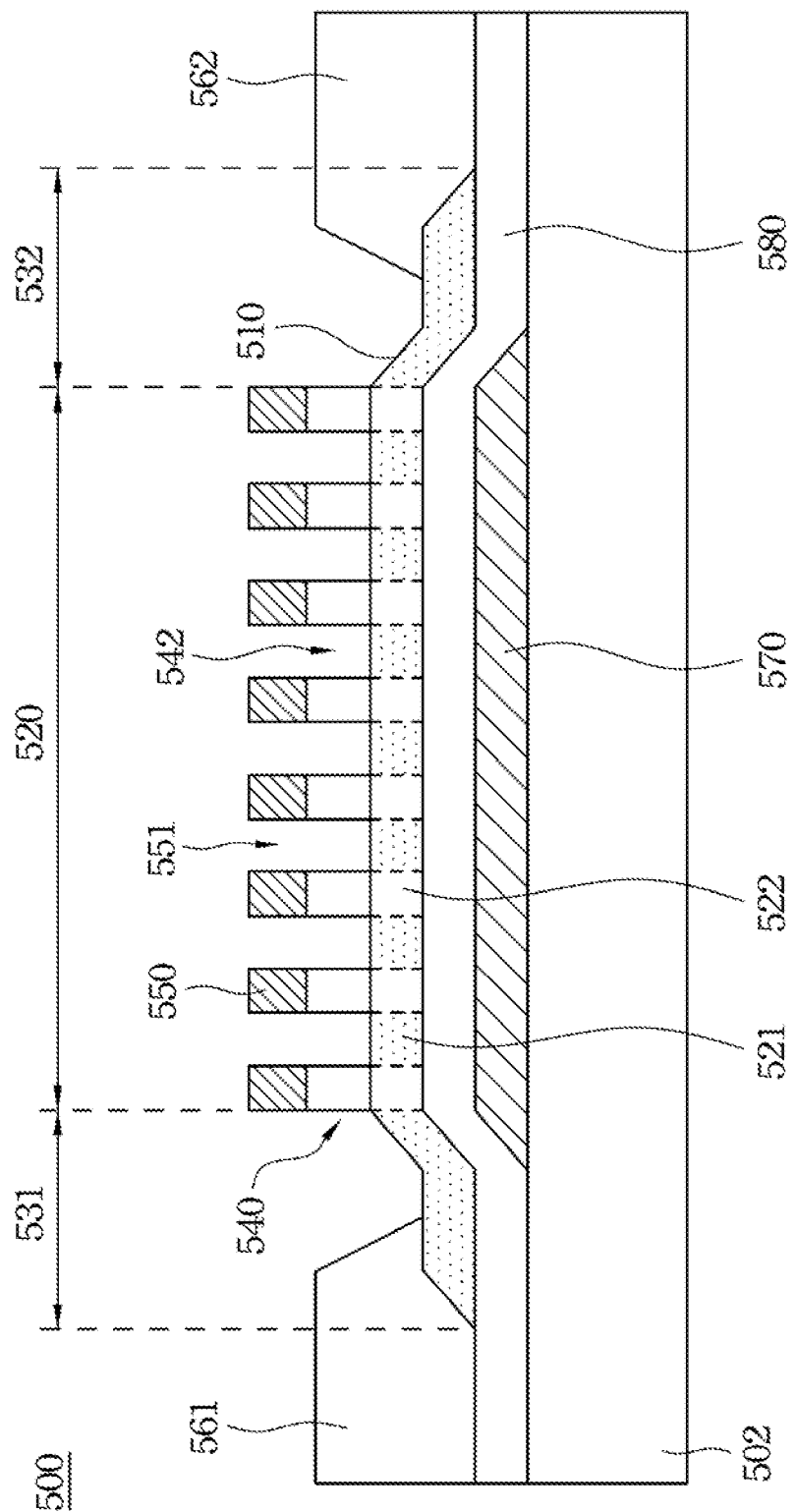
FIG. 10 is a cross-sectional view along line 3-3' in FIG. 9.

FIG. 9 is a top view schematically illustrating a thin film transistor 500 according to another embodiment of the present disclosure. FIG. 10 is a cross-sectional view along line 3-3' in FIG. 9. The thin film transistor 500 includes a metal oxide semiconductor layer 510, a first insulating layer 540, a first gate electrode 550, a source electrode 561 and a drain electrode 562.

The metal oxide semiconductor layer 510 includes a channel region 520, a source region 531 and a drain region 532. The channel region 520 has at least one first region 521 and a second region 522. The oxygen vacancy concentration of the first region 521 is greater than the oxygen vacancy concentration of the second region 522. The source region 531 and the drain region 532 of the metal oxide semiconductor layer 510 are positioned at opposite sides of the channel region 520.

The first insulating layer 540 and the first gate electrode 550 are disposed above the metal oxide semiconductor layer 510, as depicted in FIG. 10. The first insulating layer 540 is disposed on the channel region 520 of the metal oxide semiconductor layer 510. The first gate electrode 550 is disposed on the first insulating layer 540. The first gate electrode 550 has at least one first opening 551 that penetrates through the first gate electrode 550. The first opening 551 is positioned right above the first region 521. In one example, the first insulating layer 540 has at least one second opening 542 penetrating through the first insulating layer 540.

The source electrode 561 and the drain electrode 562 are respectively connected electrically to the source region 531 and the drain region 532 of the metal oxide semiconductor layer 510, as depicted in FIG. 10.

In one embodiment, the thin film transistor 500 further includes a second gate electrode 570 and a second insulating layer 580, as depicted in FIG. 10. The second gate electrode 570 and the first gate electrode 550 are disposed on opposite sides of the metal oxide semiconductor layer 510. The second insulating layer 580 is disposed between the second gate electrode 570 and the metal oxide semiconductor layer 510 such that the second gate electrode 570 is spaced apart from the metal oxide semiconductor layer 510 by the second insulating layer 580. In particular, the thin film transistor 500 may further include a substrate 502 on which the second gate electrode 570 is formed. The second insulating layer 580 covers the second gate electrode 570, and the metal oxide semiconductor layer 510 is positioned on the second insulating layer 580. In this embodiment, the orthogonal projection of the second gate electrode 570 on the substrate 502 overlaps the orthogonal projection of the first gate electrode 550 on the substrate 502. In other words, the second gate electrode 570 at least partially overlaps the first gate electrode 550 when viewed in a direction perpendicular to the metal oxide semiconductor layer 510. In one example, the area of the second gate electrode 570 is greater than or equal to the area of the first gate electrode 550. The second gate electrode 570 may has a pattern with or without openings.

Figure 11:
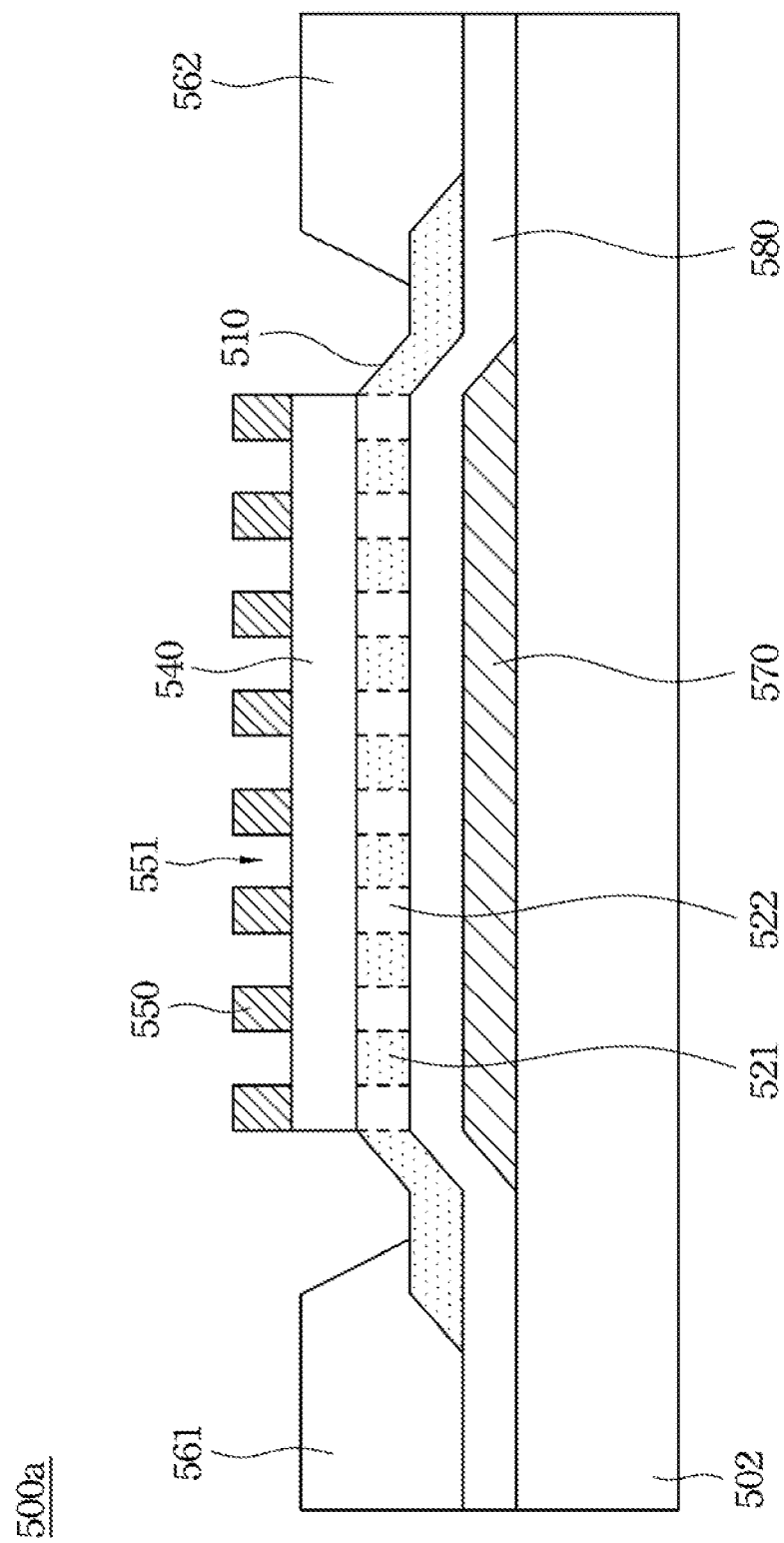
FIG. 11 is a cross-sectional view schematically illustrating a thin film transistor according to another embodiment of the present disclosure.

FIG. 11 is a cross-sectional view schematically illustrating a thin film transistor 500a according to still another embodiment of the present disclosure. The thin film transistor 500a is similar in structure to that illustrated in FIG. 10, except that the first insulating layer 540 does not have any opening. In one example, the first insulating layer 540 is made of a UV-transmissible material. Other elements such as the metal oxide semiconductor layer 510, the first gate electrode 550, the second gate electrode 570, the second insulating layer 580, the source electrode 561 and the drain electrode 562 of the thin film transistor 500a may be the same as these described hereinbefore in connection with FIG. 10.

Figure 12:
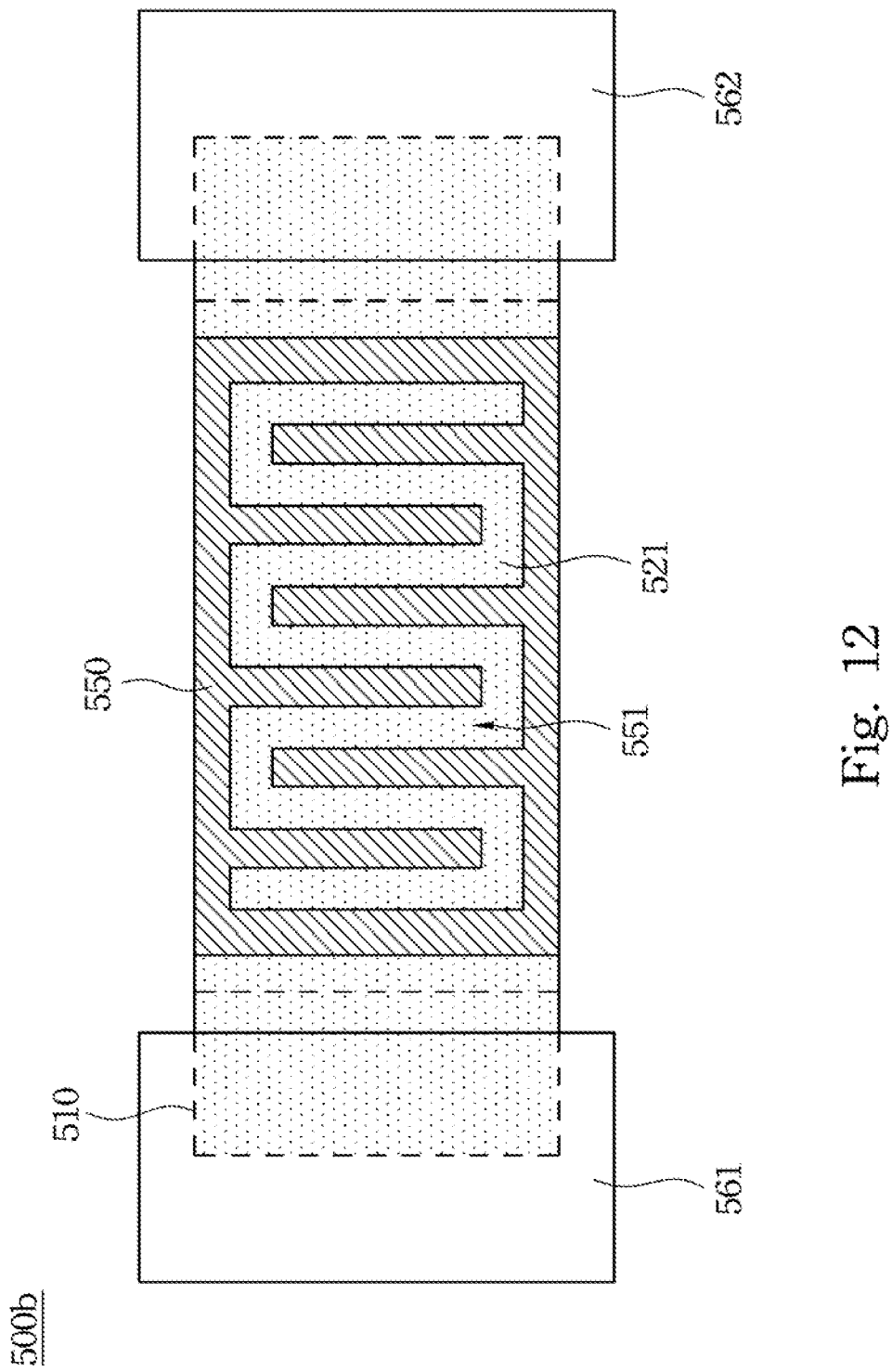
FIG. 12 is a top view schematically illustrating a thin film transistor according to still another embodiment of the present disclosure.

The present disclosure is not limited to the pluralities of the first openings and/or the first regions although embodiments described hereinbefore are illustrated by pluralities of the first openings and/or first regions. FIG. 12 is a top view schematically illustrating a thin film transistor 500b according to still another embodiment of the present disclosure. The thin film transistor 500b is similar in structure to the thin film transistor 500 illustrated in FIG. 9, except that the first gate electrode 550 only has a single first opening 551, and the channel region only has a single first region 521. The contour of the first region 521 is substantially the same as that of the first opening 551. Accordingly, the present disclosure is not limited to pluralities of first regions 521 and/or first openings 551.

According to another embodiment of the present disclosure, a method for manufacturing a thin film transistor is provided. The method includes steps described below.

Figure 13A:
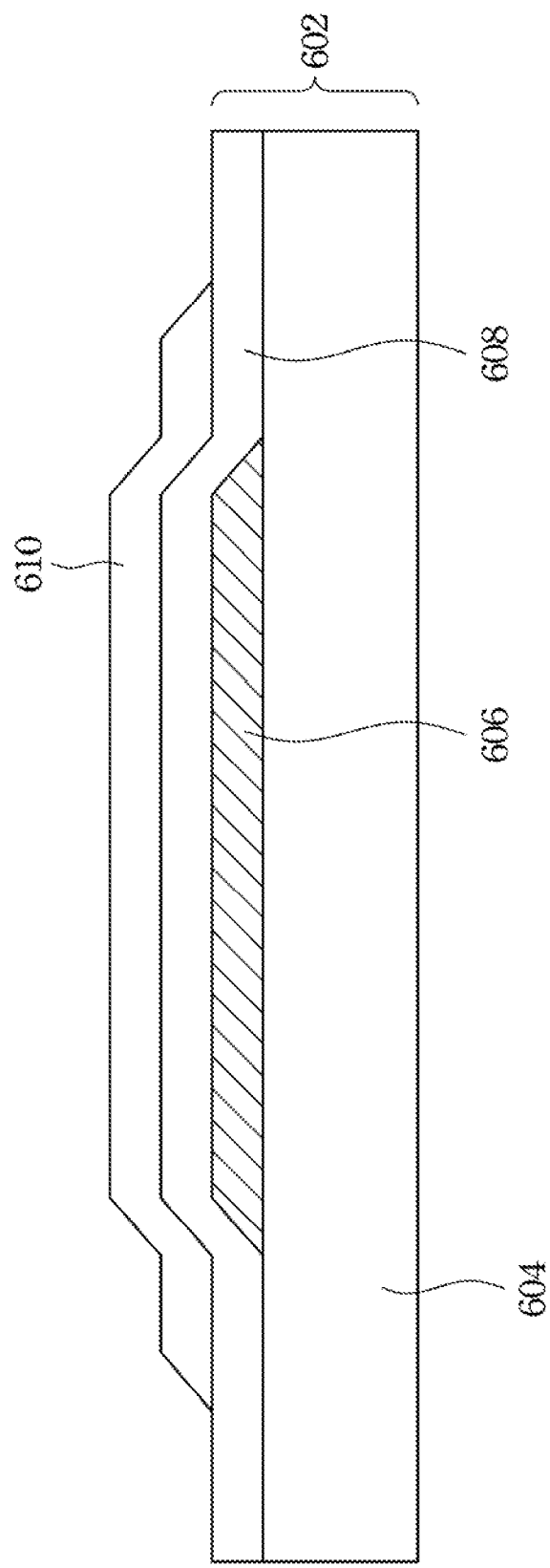
FIG. 13A-13D are cross-sectional views illustrating the process steps of a method for manufacturing a thin film transistor.

As depicted in FIG. 13A, a metal oxide semiconductor layer 610 is formed on a substrate 602. The metal oxide semiconductor layer 610 has an initial oxygen vacancy concentration. In one example, the substrate 602 includes a base plate 604, a second conductive layer 606 and a second insulating layer 608. The second conductive layer 606 is formed on the base plate 604. The second insulating layer 608 covers the second conductive layer 606. The metal oxide semiconductor layer 610 is formed on the second insulating layer 608. The second conductive layer 606 may be a bottom gate electrode, for example. The material and features of the metal oxide semiconductor layer 610 may be the same as these described hereinbefore in connection with any embodiment of the present disclosure.

Figure 13B:
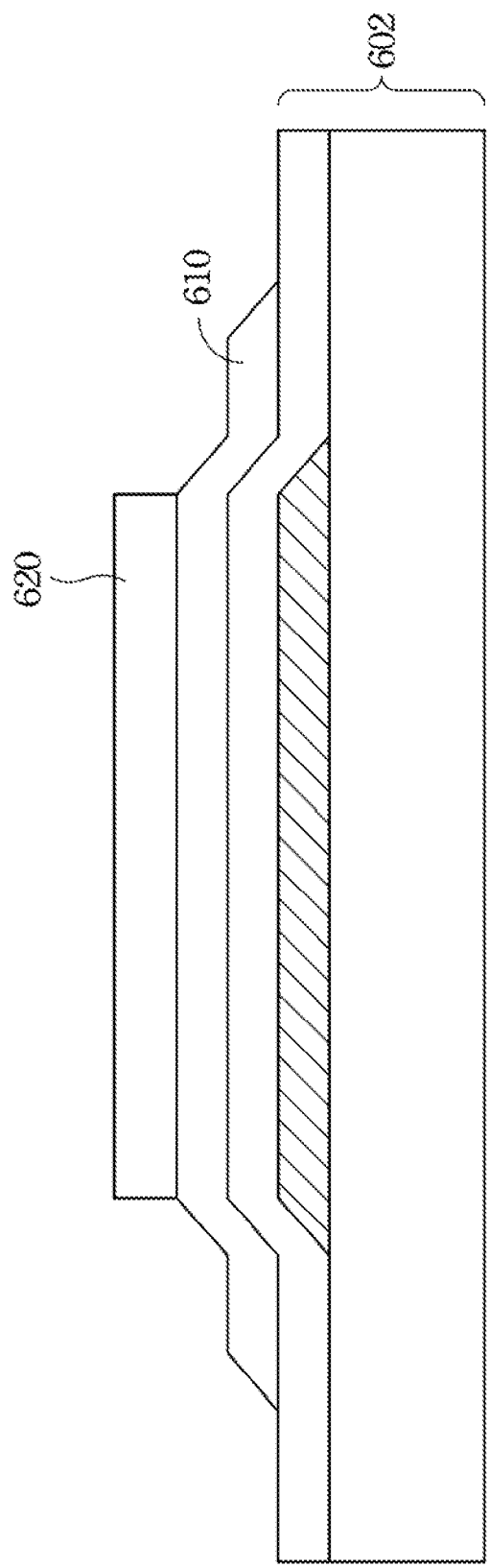

Thereafter, a first insulating layer 620 is formed on the metal oxide semiconductor layer 610 as depicted in FIG. 13B. The material and other features of the first insulating layer 620 may be the same as these described hereinbefore in connection with any embodiment of the present disclosure.

Figure 13C:
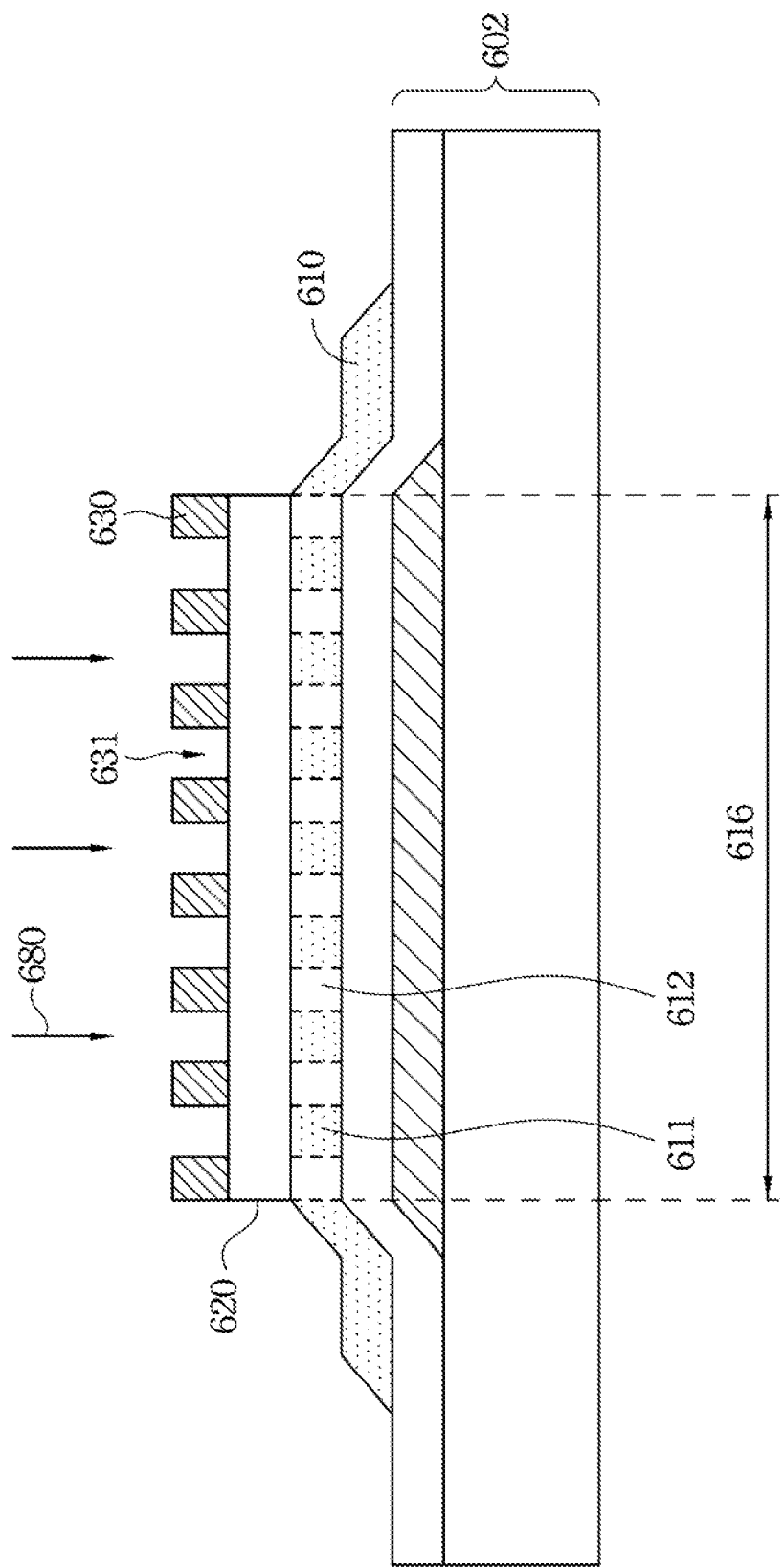

A first patterned conductive layer 630 is formed on the first insulating layer 620, as depicted in FIG. 13C. The first patterned conductive layer 630 has at least one first opening 631. The projection of the first opening 631 onto the substrate 602 is overlapped with the projection of the metal oxide semiconductor layer 610 onto the substrate 602. The first patterned conductive layer 630 may be a top gate electrode, for example. The material and other features of the first patterned conductive layer 630 may be the same as these described hereinbefore in connection with any embodiment of the present disclosure.

After the first patterned conductive layer 630 is formed, the metal oxide semiconductor layer 610 is treated to form a channel region 616 having at least one first region 611 with an oxygen vacancy concentration greater than the initial oxygen vacancy concentration, by using the first patterned conductive layer 630 as a mask. It is noted that the portion of the metal oxide semiconductor layer 610, which is shielded by the first patterned conductive layer 630, is substantially kept in its original oxygen vacancy concentration, i.e. the initial oxygen vacancy concentration. As a result, the shielded portion forms a second region 612 that is different from the first region 611. In one example, the portion of the metal oxide semiconductor layer 610 under the first opening 631 is illuminate by ultraviolet light 680, so that the oxygen vacancy concentration of this portion of the metal oxide semiconductor layer 610 is increased, and thus forming the first region 611. In another example, the first insulating layer 620 has at least one second opening 542 (shown in FIG. 10), and the exposed portion of the metal oxide semiconductor layer 610 is exposed to argon (Ar) plasma such that the oxygen vacancy concentration of the exposed portion of the metal oxide semiconductor layer 610 is increased. Alternatively, ozone is provided to the exposed portion of the metal oxide semiconductor layer 610 such that the exposed portion of the metal oxide semiconductor layer 610 is exposed to the ozone, and thereby increasing the oxygen vacancy concentration of the exposed portion of the metal oxide semiconductor layer 610.

Figure 13D:
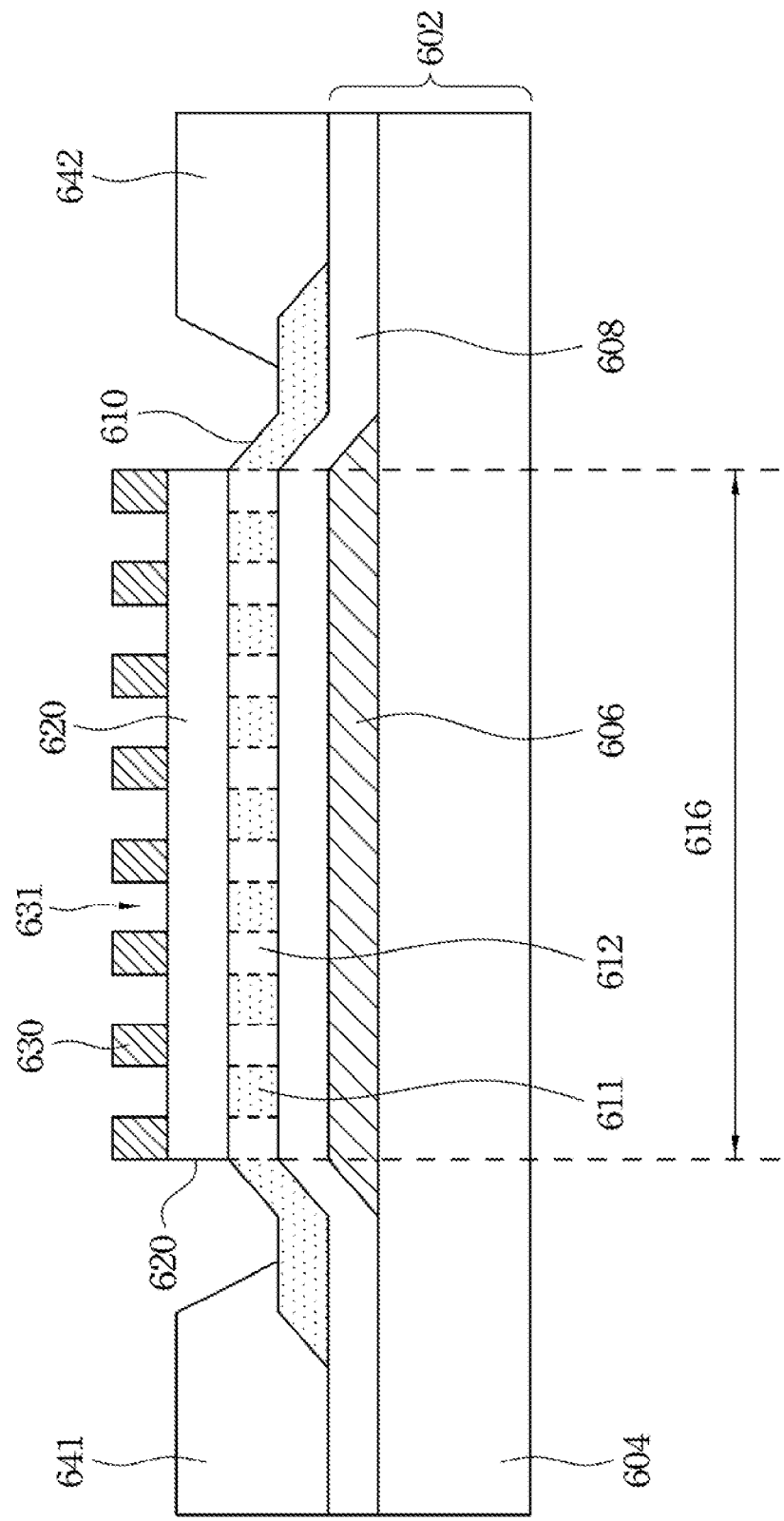

Thereafter, a source electrode 641 and a drain electrode 642 are formed respectively on opposite sides of the channel region 616, as depicted in FIG. 13D. The materials and other features of the source and drain electrodes 641, 642 may be the same as these described hereinbefore in connection with any embodiment of the present disclosure. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A thin film transistor, comprising:
   a metal oxide semiconductor layer comprising:
      a channel region having at least one first region and a second region, wherein the first region has a resitivity less than a resitivity of the second region, wherein the first region is surrounded by the second region; and
      a source region and a drain region respectively disposed at opposite sides of the channel region;
   a first insulating layer disposed on the channel region;
   a first gate electrode disposed on the first insulating aver and having at least one first opening positioned above the first region; and
   a source electrode and a drain electrode respectively connected electrically to the source region and the drain region.

2. The thin film transistor according to claim 1, wherein the channel region has a plurality of the first regions, and each of the first regions is spaced apart from another one of the first regions.

3. The thin film transistor according to claim 2, wherein the first gate electrode has a plurality of the first openings penetrating the first gate electrode, and each of the first openings is positioned right above a corresponding one of the first regions.

4. The thin film transistor according to claim 3, wherein each of the first openings has a contour that is substantially the same as a contour of the corresponding one of the first regions.

5. The thin film transistor according to claim 3, wherein the first insulating layer has a plurality of second openings penetrating the first insulating layer, and each of the second openings is substantially aligned with a corresponding one of the first openings.

6. The thin film transistor according to claim 2, wherein each of the first regions has a width of about 1 nm to about 1 μm.

7. The thin film transistor according to claim 2, wherein each of the first regions has a geometry center, and a distance between any two adjacent geometry centers is about 51 nm to about 1500 nm.

8. The thin film transistor according to claim 2, wherein a spacing, interval between any two adjacent first regions is about 50 nm to about 500 nm.

9. The thin film transistor according to claim 2, wherein the first regions are arranged in a number density of about $10^6$ mm$^{-2}$ to about $1 \times 10^7$ mm$^{-2}$.

10. The thin film transistor according to claim 1, wherein a ratio of an oxygen vacancy concentration of the first region to an oxygen vacancy concentration of the second region ranges from about 1.1 to about 1.3.

11. The thin film transistor according to claim 1, wherein the metal oxide semiconductor layer comprises indium gallium zinc oxide (IGZO).

12. The thin film transistor according to claim 1, further comprising a second gate electrode and a second insulating layer, wherein the first and second gate electrodes are respectively disposed at opposite sides of the metal oxide semiconductor layer, and the second insulating layer is positioned between the second gate electrode and the metal oxide semiconductor layer.

13. The thin film transistor according to claim 12, further comprising a substrate, wherein the second gate electrode is disposed on the substrate, the second insulating layer covers the second gate electrode, and the metal oxide semiconductor layer is positioned on the second insulating layer.

14. The thin film transistor according to claim 12, wherein the second gate electrode overlaps the first gate electrode in a direction perpendicular to the metal oxide semiconductor layer.

15. The thin film transistor according to claim 12, wherein the second gate electrode has an area that is greater than or equal to an area of the first gate electrode.

16. The thin film transistor according to claim 1, wherein the first opening has a contour that is substantially the same as a contour of the first region.

17. The thin film transistor according to claim 1, wherein the first insulating layer has at least one second opening penetrating the first insulating layer, and the second opening is substantially aligned with the first opening.

* * * * *